July 23, 1968 J. LINDMAYER 3,394,289

SMALL JUNCTION AREA S-M-S TRANSISTOR

Filed May 26, 1965

INVENTOR

Joseph Lindmayer

BY Connolly and Hutz

ATTORNEYS

United States Patent Office 3,394,289

Patented July 23, 1968

3,394,289

SMALL JUNCTION AREA S-M-S TRANSISTOR

Joseph Lindmayer, Williamstown, Mass., assignor to Sprague Electric Company, North Adams, Mass., a corporation of Massachusetts Filed May 26, 1965, Ser. No. 459,049

3 Claims. (Cl. 317—235)

ABSTRACT OF THE DISCLOSURE

A metal base layer is sandwiched between two substantially intrinsic semiconductor layers with a small region of high conductivity and of one conductivity type within each intrinsic layer in contact with the base layer so as to provide small emitter and collector junction areas within a large overall structure.

This invention relates to a transistor device having a thin metallic layer between two layers of semiconductor material, and more particularly to a method of producing such a device suitable for use at high frequencies.

Transistors having a thin metallic layer between two semiconductor layers (hereinafter identified as S-M-S transistors), generally, must be made extremely small so as to reduce the inherent capacitances of the device to values which will permit satisfactory high frequency performance.

It is an object of this invention to overcome the aforegoing disadvantages.

It is a further object of this invention to produce an S-M-S transistor having low capacitances.

It is a still further object of this invention to provide a novel method of producing an S-M-S transistor.

A still further object of this invention is the production of a transistor having a thin metallic layer in contact with a small emitter and collector area which are surrounded by substantially intrinsic regions.

These and other objects of this invention will become apparent from the following specification and the accompanying drawings, in which.

In its broadest scope, the invention provides a transistor in which a metallic layer is sandwiched between two substantially intrinsic semiconductor layers having an emitter and collector region extending through the substantially intrinsic layers to the base.

In a more limited sense, the invention provides a transistor in which a metallic layer is sandwiched between two substantially intrinsic layers. A high conductivity emitter region of small area extends transversely through the center of one of said intrinsic layers, from the metallic layer to the surface of said one intrinsic layer; and a high conductivity collector region of small area extends transversely through the center of the other of said intrinsic layers to the metallic layer. Both regions are of the same conductivity type.

Briefly, the process comprises the steps of forming a first semiconductor layer of low conductivity, forming a metallic layer over the first layer, forming a second semiconductor layer of low conductivity on the metallic layer, forming regions of high conductivity in the first and second semiconductor layers, and doping the structure with a deep energy level impurity to make the remaining low conductivity regions substantially intrinsic regions.

More specifically, the process comprises the steps of epitaxially growing a first semiconductor layer of low conductivity, but the same conductivity type, on a collector wafer of high conductivity, depositing a thin metallic layer on the first layer, epitaxially growing a second semiconductor layer of low conductivity and the same conductivity type on the metallic layer, diffusing regions of high conductivity and the same conductivity type in the epitaxial layers to form a collector region in the first layer and an emitter region in the second layer, and gold doping the layers to make the remaining low conductivity portions substantially intrinsic.

Figure 1:
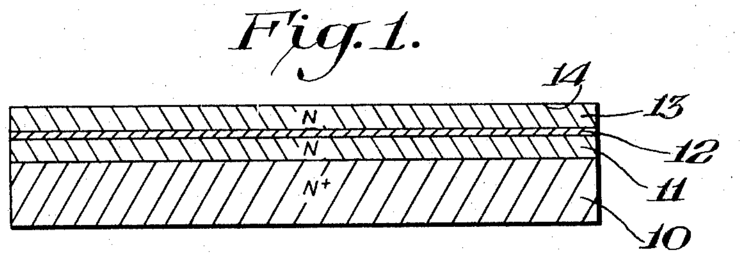
FIGURE 1 is a sectional view of a metal layer between two semiconductor layers disposed upon a semiconductor wafer.

Referring now to FIGURE 1, a collector wafer 10 is shown underlying a semiconductor layer 11, a thin metallic layer 12 and a second semiconductor layer 13. The structure is produced by epitaxially growing a layer 11 of low N-type conductivity upon a wafer 10 of high N-type conductivity. The layer may be grown, for example, by the reduction of silicon tetrachloride in hydrogen at a temperature of 1250° C. The thin metallic layer 12 is then deposited upon layer 11, for example, by the reduction of gaseous molybdenum pentachloride at temperatures from 750° C. to 1250° C. Finally an epitaxial layer 13 of low N-type conductivity is grown on the metallic layer 12 by the same method utilized for layer 11.

In the drawing, high conductivity N-type regions have been designated as "N+." Low conductivity N-type regions have been labeled as "N," and intrinsic regions as "I."

The metallic layer 12 is preferably extremely thin. Typical values for the thickness of this layer are from 50 to 500 Angstrom units. The upper limit is that the layer thickness must not exceed the mean free path of charge carriers traversing the metallic layer.

The structure described in the foregoing embodiment can be effected by other means. For example, the metallic layer may be formed by vapor deposition. Similar results may be obtained when chromium and titanium are used in place of molybdenum; vanadium and tungsten are also suitable.

Figure 2:
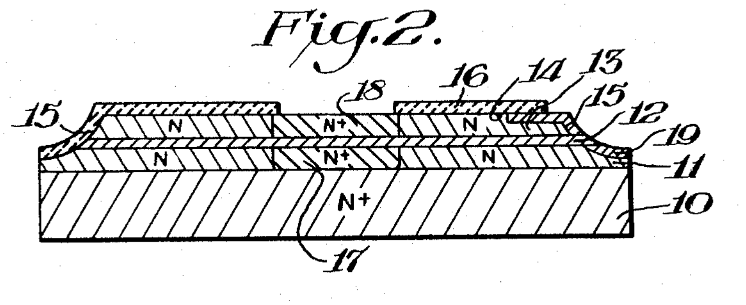
FIGURE 2 is a sectional view of the structure of FIGURE 1 showing diffused regions.

The structure is then shaped in the form of a mesa as in FIGURE 2 by any suitable means, such as for example, by etching. This may be accomplished by directing a positive biased jet of etching solution, such as hydrochloric or hydrofluoric acid, at the negatively biased structure to produce the surface 15.

It is preferable that surface 15 intersect the plane of the metallic layer 12 at less than a 90° angle to increase the exposure of layer 12 at this point.

A protective passivating layer 16 of silicon dioxide is provided over surface 15 and surface 14. Impurities are then diffused into the structure through suitable openings etched in the passivating layer 16.

An N-type impurity is diffused, by known techniques in accordance with principles set out in "Diffusion in Semiconductors" by B. I. Boltaks, Academic Press, New York, 1963, and "Diffusion in Solids, Liquids, Gases" by W. Jost, Academic Press, New York, 1960, into layers 11 and 13 to create high conductivity N-type regions 17 and 18 in these layers. The diffusion is accomplished by depositing a dopant, such as phosphorus antimony or arsenic, upon surface 14 and heating at elevated temperatures to diffuse the impurity into layer 13 and through the metallic layer 12 into layer 11, to create regions 17 and 18. As shown in FIGURE 2, region 18 extends from the surface 14 to the metal layer 12 to make the emitter of the transistor. Whereas region 17 extends from the metal layer 12, opposite region 18, to the collector wafer 10. Thus region 17 and wafer 10 make up the collector of the transistor.

A suitable P-type dopant is diffused into surface 15 through an opening in the passivated layer 16 to produce a high conductivity P-type region 19 enclosing the edge of the metallic layer 12. Boron, aluminum, indium, and galium may be used to promote P-type conduction in the N-type layers 11 and 13 and thereby permit a low resistance connection to be made to metallic layer 12.

The transistor capacitances are then reduced by doping the structure with a deep level impurity of sufficient concentration to make the low conductivity portions of the layers become substantially intrinsic, while not substantially effecting the high conductivity regions or the wafer.

This is accomplished in the preferred embodiment by removing the oxide 16, by etching or the like, and doping the structure with a deep level impurity such as, for example, gold or the like. The concentration, of the deep level impurity, is such as to make the low conductivity portions substantially intrinsic, without substantially reducing the impurity concentration of the high conductivity portions of the structure.

Figure 3:
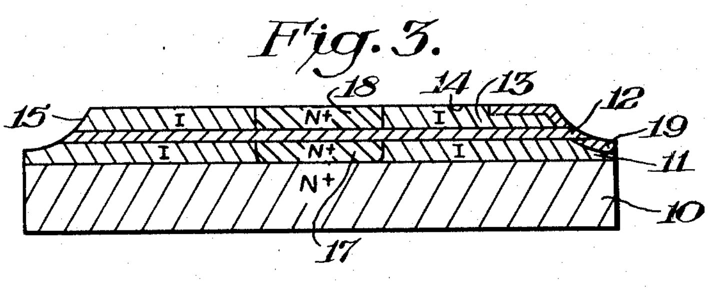
FIGURE 3 is a sectional view of the structure of FIGURE 2 with intrinsic regions formed within; and, FIGURE 4 is a sectional view of the completed transistor.

For example a structure is fabricated, as described, with low and high conductivity portions having suitable impurity concentrations of $10^{15}$ and $10^{19}$ atoms/cm.$^3$, respectively. Thereafter the structure is doped with gold or the like by suitable means such as by diffusion or the like. Accordingly, gold is deposited upon the upper surface 14, as shown in FIGURE 3, and diffused into the structure by heating at elevated temperatures. The amount of impurity is controlled to produce a deep level impurity concentration of slightly more than $10^{15}$ atoms/cm.$^3$ but less then $10^{19}$ atoms/cm.$^3$. This results in a structure shown in FIGURE 3. Here the collector is made up of a large area wafer 10 with a projection of small area, region 17, in contact with the metallic layer 12. The region 17 is enclosed by the substantially intrinsic portion of layer 11. The emitter consists of region 18 which is in contact with the metallic layer 12 opposite the collector projection 17. Emitter region 18 is enclosed by the substantially intrinsic portion of layer 13. The metal layer 12 is also in contact at the edge of the structure with contact region 19.

Thus the transistor will have low capacitance, as a result of the small junction areas and the intrinsic portions, while the overall structure still remains of reasonable size.

Figure 4:
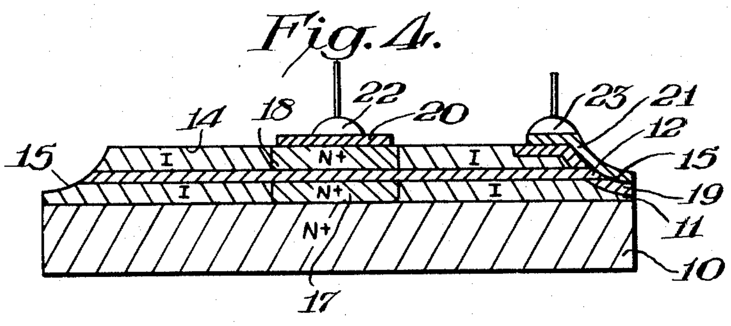

The transistor is completed as shown in FIGURE 4 by metallizing the exposed surface of the emitter 18 and the region 19 to make low resistance contacts 20 and 21, respectively, to these regions. The contact 21 may be brought up to the top surface 14 as shown to facilitate lead connection. Metal terminals 22 and 23, preferably aluminum, are then attached to the contacts 20 and 21. A collector contact may be provided in the same manner as the above at any point on the wafer 10.

As shown, the metallized contact with the metallic layer 12 covers only a small area; however, it should be understood that such contact could encompass a large portion of the mesa perimeter, thereby increasing the contact area to the thin metallic layer.

Although the preferred embodiment has been described in terms of N-type regions 10, 17 and 18 with P-type region 19, the invention may also be applied to P-Metal-P transistors since the conductivity of P-type regions may also be reduced by the use of a deep level impurity such as gold.

Furthermore, although the invention has been described in terms of a specific embodiment, it should be understood that many different modifications of this invention may be made without departing from the spirit and scope thereof, and that the invention is not to be limited except as defined in the appended claims.

What is claimed is:

1. A transistor comprising a large area wafer having high conductivity of one conductivity type, a first semiconductor layer of substantially intrinsic conductivity overlying said wafer, a metallic layer on said first layer, a second semiconductor layer of substantially intrinsic conductivity overlying said metallic layer, an emitter region of small area and high conductivity of said one conductivity type extending through said second layer to said metal layer, and a collector region of small area and high conductivity of said one conductivity type extending through said first layer from said wafer to said metal layer to provide a collector or large area having a projection of small area enclosed by the substantially intrinsic portion of said first layer.

2. A transistor as claimed in claim 1 wherein said high conductivity regions extend transversely through said intrinsic layers, and said one conductivity type is N-type.

3. A transistor as claimed in claim 1 wherein said high conductivity regions extend transversely through said intrinsic layers, and said one conductivity type is P-type.

References Cited

UNITED STATES PATENTS

| | | | |
|---|---|---|---|
| 2,770,761 | 11/1956 | Pfann | 317—235 |
| 3,121,809 | 2/1964 | Atalla | 307—88.5 |
| 3,277,351 | 10/1966 | Osatune et al. | 317—234 |

JOHN W. HUCKERT, *Primary Examiner.*

A. M. LESNIAK, *Assistant Examiner.*